Figure 1:
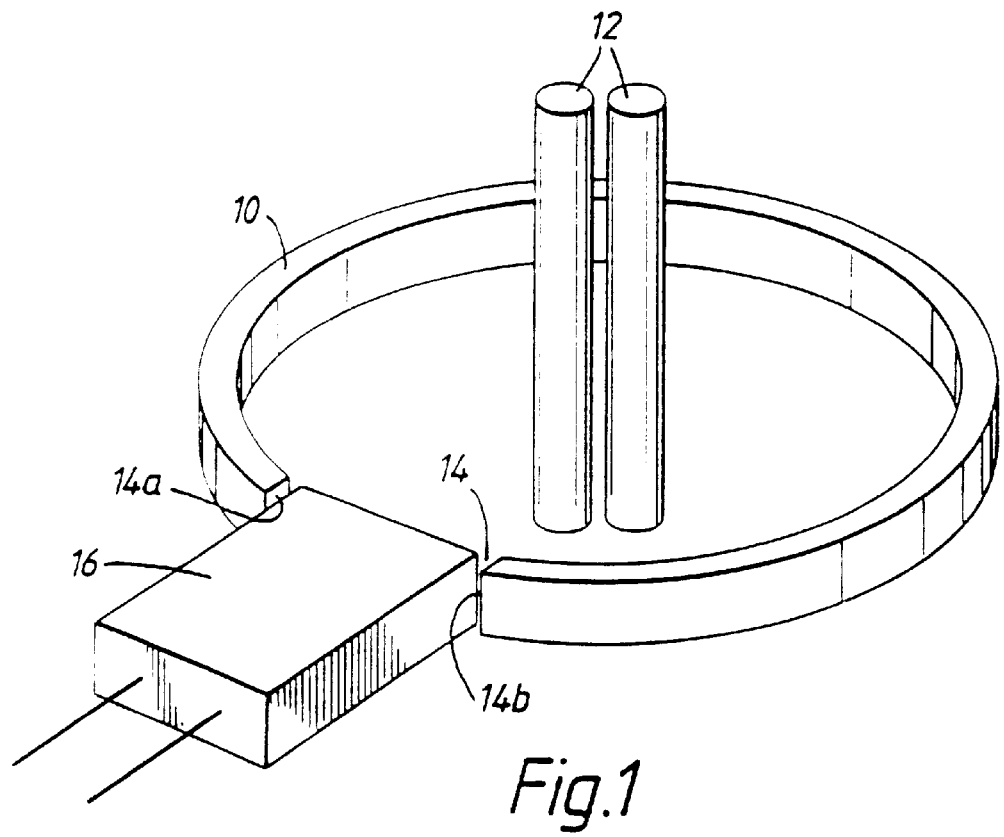

United States Patent
Powell

[11] Patent Number: 5,986,444
[45] Date of Patent: Nov. 16, 1999

[54] DEVICE HAVING A SHAPED, MAGNETIC TOROIDAL MEMBER AND A MAGNETORESISTIVE SENSOR FOR DETECTING LOW MAGNITUDE ELECTRICAL CURRENTS

[75] Inventor: Simon Powell, Cambridge, United Kingdom

[73] Assignee: Power Breaker PLC, Harlow, United Kingdom

[21] Appl. No.: 08/849,106

[22] PCT Filed: Nov. 10, 1995

[86] PCT No.: PCT/GB95/02642

§ 371 Date: Jun. 9, 1997

§ 102(e) Date: Jun. 9, 1997

[87] PCT Pub. No.: WO96/15460

PCT Pub. Date: May 23, 1996

[30] Foreign Application Priority Data

Nov. 10, 1994 [GB] United Kingdom ................... 9422714

[51] Int. Cl.[6] .......................... G01R 19/00; G01R 31/02; G01R 33/09
[52] U.S. Cl. ..................... 324/117 R; 324/509; 324/252; 340/650
[58] Field of Search ............................... 324/252, 117 R, 324/117 H, 127, 142, 509–511; 336/175, 178; 340/649–651, 664

[56] References Cited

U.S. PATENT DOCUMENTS

| | | | |
|---|---|---|---|
| 5,103,163 | 4/1992 | McLynn | 324/117 H |
| 5,694,103 | 12/1997 | Goodwin et al. | 324/117 H |
| 5,734,264 | 3/1998 | Berna et al. | 324/117 H |

FOREIGN PATENT DOCUMENTS

| | | |
|---|---|---|
| 0242560 | 10/1987 | European Pat. Off. . |
| 0243630 | 11/1987 | European Pat. Off. . |

OTHER PUBLICATIONS

Ruhl et al, "Stromsensor als Mikrosystem", Electronik, vol. 42, No. 5, Oct. 1993, Munchen, DE, pp. 42–44.

*Primary Examiner*—Gerard Strecker
*Attorney, Agent, or Firm*—Watson Cole Grindle Watson, P.L.L.C.

[57] ABSTRACT

A device for detecting low magnitude electrical currents includes a generally toroidally-shaped member made of magnetic material that provides an air gap, and a magnetoresistive device in the form of a bridge located in the air gap for sensing a current flowing through a conductor that passes through the member. In order to reduce damage due to overcurrents, the member has a portion of reduced cross-sectional area to cause saturation of the member. The device can be used in an earth leakage current detector.

5 Claims, 1 Drawing Sheet

DEVICE HAVING A SHAPED, MAGNETIC TOROIDAL MEMBER AND A MAGNETORESISTIVE SENSOR FOR DETECTING LOW MAGNITUDE ELECTRICAL CURRENTS

BACKGROUND OF THE INVENTION

1. Field of the Invention

The present invention relates to the detection of electrical currents and more particularly to a device for detecting low magnitude electrical currents.

2. The Prior Art

There are a number of situations where it is necessary to detect electrical currents so that they can be monitored, and there have been a number of different proposals put forward for achieving this. In the field of residual current devices, it is customary to detect an imbalance in current flow through live and neutral conductors by passing the conductors through a toroid of magnetic material and having a sensing winding around part of the toroid. This arrangement is such that if there is an earth leakage fault, there is an imbalance between the current flowing in the live conductor with respect of the current flowing in the neutral conductor, and this imbalance results in a current being induced into the sensing winding. This winding is then connected to suitable circuitry for indicating the presence of the fault condition.

Residual current devices have become more and more popular and there is consequently a continuing need to be able to manufacture such devices in as efficient and cost effective a manner as possible. Attention has therefore been directed to the need for a sensor coil to be wound on a toroid as this is a relatively expensive operation.

European Patent Application EP-A-0242560 describes an arrangement for non-contact measurement of the electric current in a conductor, and relates to a device having a magnetic core surrounding the conductor. In a gap in the magnetic core is a gap in which is positioned a magnetic field sensor. The aim of this prior invention is to increase the measuring sensitivity of the device, and this is achieved preferably by utilising a magnetic core whose cross-sectional area becomes greater with increasing distance from the gap.

It is known from the article "Stromsensor als Mikrosystem" (Elektronik, vol. 42 No. 5 October 1993. Munchen, DE; pages 42–44, XP 000396422; Rühl et al) that different types of devices may be placed in the air gap of a toroidailly-shaped member in order to sense currents.

SUMMARY OF THE INVENTION

The present invention proposes to use a magneto resistive device to replace the sensor coil in an RCD device, for example. However, the use of a magneto resistive device is not without its problems, and consequently the present invention further provides a generally toroidially-shaped member which is arranged to saturate at a predetermined level of magnetic flux.

According to the present invention there is provided a device for detecting a low magnitude net electrical current comprising a generally toroidally-shaped member of magnetic material provided with an air-gap and a sensor disposed in the air-gap for sensing a magnetic flux indicative of the net current flowing in conductor means passing through the toroidally-shaped member, characterised in that the sensor is a magneto-resistive device; and
at least a portion of the toroidally-shaped member is shaped whereby to cause saturation of the member at a predetermined level of magnetic flux.

Figure 2:
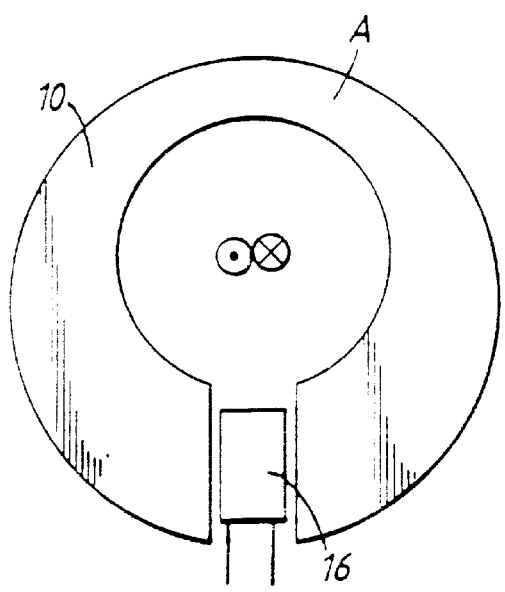
Figure 3:
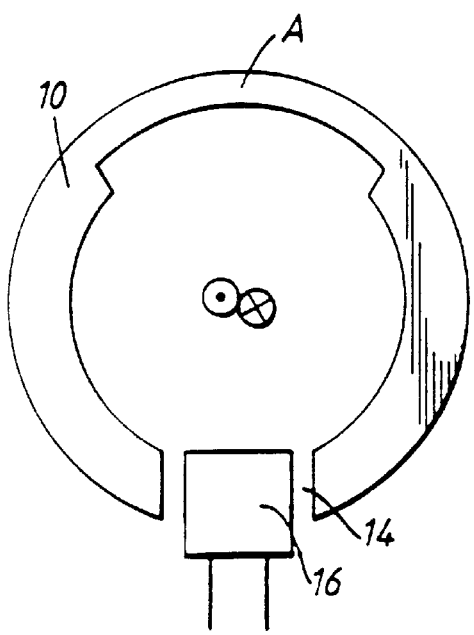

In order that the present invention be more readily understood, an embodiment thereof will now be described by way of example with reference to the accompanying drawings in which FIG. 1 is a diagrammatic perspective view showing the general arrangement according to the present invention;

FIG. 2 shows one form of a toroidially-shaped member for use with the present invention; and FIG. 3 shows an alternative form of the toroidially-shaped member for use with the present invention.

Magneto resistive detectors are known and in particular magneto resistive bridge devices have been produced which will change their resistance as a function of applied magnetic field. A characteristic of existing devices is that they are only linear over a small proportion of their range and further it is necessary to bias each resistor of the bridge using a permanently magnetic coating. In the past, this has meant that magneto resistor devices have been restricted to uses where the amount of flux to be detected has been small enough to ensure that the permanent magnetic coating would not be destroyed as might result if large magnetic fields were to be impressed upon the device. This is particularly a problem when one is considering residual current devices where one is attempting to monitor fault currents of the order of 30 milliamps but it is possible that currents of the order of amps might well pass through the conductors which would in turn impress very large magnetic fields on the magneto resistive device.

If one now turns to FIG. 1, the general arrangement of a sensor for a residual current device is shown and it will be seen that it comprises a magnetic field enhancement device in the form of a toroidially-shaped member 10 through which pass conductors 12 which are respectively connected to the live and neutral supplies to the residual current device. The toroidially-shaped member 10 is provided with an air gap indicated by the reference numeral 14 and a magneto resistive device in the form of a magneto resistor bridge 16 is disposed at the air gap so as to be affected by the flux passing between the faces 14a, 14b of the toroidially-shaped member. This is a necessary feature since the MR element requires an in plane applied field for optimised field sensing. The MRs employed in the sensor, are fabricated in a serpentine shape feature so as to increase the total resistance per unit area. The sensors were fabricated using RF sputtering and standard photolithography processes with track widths of the sensor being 110 $\mu$m, with an inter-element gap or 2 $\mu$m. The track width is designed to reduce the effect of demagnetising fields at the edge of the thin film tracks and thus increase the sensitivity of the sensor [2]. The increase in sensitivity leads to a decrease in the saturation fields of sensor. This feature may be ultimately designed for different ranges of sensitivity and saturation by employing varying track widths.

With current flowing in the mains conductor, an in plane magnetic field is applied to the sensor. The intensity of this field is directly proportional to the magnitude and direction of the current in the wire and the magnetic circuit, coupling with the field generated due to the conductor. The four elements of the bridge are complementary in their characteristics, providing for thermal drift reduction. The change in the overall resistance of the MR bridge is a function of the applied field. Signals from the bridge may be AC coupled to an instrumentation type amplifier, so as to reduce zero error. The sensors were supplied with a low noise battery operated current source.

The conductors 12 are preferably twisted together at least in the area of the toroidially-shaped member 10 so as to ensure equalization of currents and the arrangement is such that in the absence of a fault condition, there is no magnetic flux in the air gap 14. However, in the presence of an earth leakage fault there is an imbalance in current flow through the conductors 12 which in turn causes a magnetic flux to be created in the toroidially-shaped member. The magneto resistor bridge 16 detects the presence of the magnetic field in the air gap and produces a signal which can then be processed in the usual way. The toroidially-shaped member 10 is made of a high permeability material so as to provide the necessary sensitivity bearing in mind that the fault currents used to induce a magnetic field are of the order of 30 milliamps or less. Additionally, the toroidally-shaped member 10 is shaped to cause the member to saturate and this is most readily achieved by producing a reduced cross-sectional area portion as indicated by the letter A in FIG. 2 or FIG. 3 as compared with the cross sectional area of the faces 14*a* and 14*b*. It will be noted that the reduced cross-sectional area is remote from the air gap. By careful design of the reduced cross-sectional area, it is possible to limit the amount of flux in the air gap to a level such that damage to the magneto resistor bridge device 16 will be avoided under all conditions of current.

It is intended that the overall device will be housed in a metal box to protect the toroid and magneto resistor bridge from stray electromagnetic fields.

I claim:

1. A device for detecting a low magnitude electrical current comprising a generally toroidally-shaped member of magnetic material provided with an air-gap and a sensor disposed in the air-gap for sensing a magnetic flux indicative of the current flowing in conductor means passing through the toroidally-shaped member, wherein the sensor is a magneto-resistive device; and at least a portion of the toroidally-shaped member is shaped to cause saturation of the member at a predetermined level of magnetic flux and prevent damage to said magneto-resistive sensor device.

2. A device according to claim 1 wherein a portion of the member shaped to cause saturation of the member is a portion of reduced cross-sectional area.

3. A device according to claim 2, wherein the portion of reduced cross-sectional area extends only over a portion of the toroidally-shaped member remote from the air-gap.

4. A device according to claim 1, wherein the magneto-resistive device is in the form of a bridge.

5. A residual current device including a device for detecting low magnitude net electrical currents according to claim 1.

* * * * *